(12) United States Patent
Wang et al.

(10) Patent No.: US 12,133,341 B2
(45) Date of Patent: Oct. 29, 2024

(54) DISPLAY MODULE AND DISPLAY DEVICE (71) Applicants: Chengdu BOE Optoelectronics Technology Co., Ltd., Sichuan (CN); BOE Technology Group Co., Ltd., Beijing (CN)

(72) Inventors: Zhihui Wang, Beijing (CN); Ren Xiong, Beijing (CN); Lei Yang, Beijing (CN); Fengping Wu, Beijing (CN); Huiqiang Song, Beijing (CN); Ce Wang, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/781,027

(22) PCT Filed: Apr. 13, 2021

(86) PCT No.: PCT/CN2021/086932
§ 371 (c)(1),
(2) Date: May 30, 2022

(87) PCT Pub. No.: WO2022/217454
PCT Pub. Date: Oct. 20, 2022

(65) Prior Publication Data
US 2024/0206084 A1    Jun. 20, 2024

(51) Int. Cl.
*H05K 5/00*    (2006.01)
*G06F 1/16*    (2006.01)
(Continued)

(52) U.S. Cl.
CPC ........... *H05K 5/006* (2013.01); *G06F 1/1652* (2013.01); *H05K 1/189* (2013.01); *H05K 5/0069* (2013.01);
(Continued)

(58) Field of Classification Search
CPC ...... H05K 5/006; H05K 1/189; H10K 77/111; G06F 1/1652; G06F 1/1662
(Continued)

(56) References Cited

U.S. PATENT DOCUMENTS

2019/0207141 A1    7/2019  Kim et al.
2020/0137900 A1*   4/2020  Park ......................... H05K 5/03
(Continued)

FOREIGN PATENT DOCUMENTS

CN    108766247 A    11/2018
CN    110767096 A    2/2020
(Continued)

*Primary Examiner* — Andargie M Aychillhum
(74) *Attorney, Agent, or Firm* — IPro, PLLC (57) ABSTRACT

A display module and a display device are disclosed. The display module includes a display substrate provided with a first edge; a circuit board arranged at the first edge of the display substrate and electrically connected with the display substrate; and a supporting plate arranged on the non-display surface of the display substrate; the supporting plate is able to be bent and includes a first part and a second part, and the second part is provided with a hollow opening; the display substrate is positioned on the first part and is fixedly connected with the first part; and the circuit board is positioned on the second part and is fixedly connected with the second part.

18 Claims, 3 Drawing Sheets

(51) Int. Cl.
*H05K 1/18* (2006.01)
*H10K 77/10* (2023.01)
*H10K 102/00* (2023.01)

(52) U.S. Cl.
CPC .......... *H10K 77/111* (2023.02); *G06F 1/1662* (2013.01); *H10K 2102/311* (2023.02)

(58) Field of Classification Search
USPC ........................................................ 361/749
See application file for complete search history.

(56) References Cited

U.S. PATENT DOCUMENTS

2020/0196496 A1* 6/2020 Shin ..................... G06F 1/1652
2021/0153363 A1    5/2021 Cao et al.
2022/0343809 A1   10/2022 Chen et al.

FOREIGN PATENT DOCUMENTS

CN    210925298 U    7/2020
CN    211928943 U   11/2020
CN    112289750 A    1/2021

\* cited by examiner

Fig. 1

--Prior Art--

DISPLAY MODULE AND DISPLAY DEVICE

CROSS-REFERENCE TO RELATED APPLICATION

This application is a national phase entry under 35 U.S.C § 371 of International Application No. PCT/CN2021/086932, filed Apr. 13, 2021.

FIELD

The disclosure relates to the technical field of display, in particular to a display module and a display device.

BACKGROUND

At present, the base materials of OLED modules are mostly flexible materials, and in order to achieve a large proportion of the screen, the cover plate is often almost as large as the display substrate, while the FPC, PCB and other parts are exposed. When the module of this design is delivered, the FPC and PCB cannot be fixed with the cover plate and are in a movable state, and the FPC binding position is easy to loosen or the FPC is easy to crack during the turnover and whole-machine assembly of the module products.

SUMMARY

The disclosure discloses a display module and a display device. The display module including:
- a display substrate, which is provided with a first edge;
- a circuit board, which is arranged at the first edge of the display substrate and is electrically connected with the display substrate; and
- a supporting plate, which is arranged on a non-display surface of the display substrate; wherein the supporting plate is able to be bent and includes a first part and a second part, and the second part is provided with a hollow opening: the display substrate is positioned on the first part and is fixedly connected with the first part; and the circuit board is positioned on the second part and is fixedly connected with the second part.

Optionally, the circuit board includes a soft part and a hard part, the hard part is arranged on the side, away from the display substrate, of the soft part, and the soft part is able to be bent; and
the second part of the supporting plate includes a connecting part and a fixed part: the fixed part is arranged on a side, away from the first part, of the connecting part, and the connecting part is provided with the hollow opening: the soft part is arranged on the connecting part, and the hard part is arranged on the fixed part and fixedly connected with the fixed part.

Optionally, the hard part is provided with first positioning holes; and
the fixed part of the supporting plate is provided with second positioning holes corresponding to the first positioning holes, and projections of the first positioning holes on a plane where the supporting plate is located are overlapped with the second positioning holes.

Optionally, the hard part is in a strip shape and extends along the first edge of the display substrate; and
the hard part is provided with two first positioning holes, and the two first positioning holes are arranged at two ends of the hard part respectively.

Optionally, the display module further includes connectors, wherein the connectors are configured to penetrate through the first positioning holes and the second positioning holes to fix the hard part and the fixed part of the supporting plate.

Optionally, a projection, on the plane where the supporting plate is located, of the hard part roughly coincides with the fixed part; and a distance between a projection of an edge of the hard part on the plane where the supporting plate is located and an edge of the fixed part closest to the edge of the hard part ranges from 0 mm to 0.5 mm.

Optionally, the hard part includes a second edge, and the second edge is close to the first edge of the display substrate; and
projections of edges, other than the second edge, in the hard part on the plane where the supporting plate is located are not overlapped with the fixed part.

Optionally, the projection of the display substrate on the plane where the supporting plate is located roughly coincides with the first part; and a distance between a projection of each edge of the display substrate on the plane where the supporting plate is located and an edge of the first part closest to the each edge of the display substrate ranges from 0 mm to 0.5 mm.

Optionally, the display module further includes a cover plate arranged on a side, away from the supporting plate, of the display substrate, and the cover plate is made of a flexible material; and
projections of edges, other than an edge close to one side of the second part, in the first part on the plane where the display substrate is located are not overlapped with the display substrate.

Optionally, a width of the connecting part and a width of the fixed part of the supporting plate are smaller than a width of the first part in an extending direction of the first edge of the display substrate.

Optionally, the width of the connecting part of the supporting plate is identical to the width of the fixed part of the supporting plate in the extending direction of the first edge of the display substrate.

Optionally, the hollow opening includes at least two rows of through holes, each row of through holes are arranged in the extending direction of the first edge of the display substrate, and through holes in an odd number rows and through holes in an even number rows are at least partially staggered.

Optionally, the through hole is a strip-shaped hole extending in the extending direction of the first edge.

Optionally, the supporting plate is of an integrated structure.

Optionally, the supporting plate is a stainless steel plate.

Optionally, a thickness of the supporting plate ranges from 50 micrometers to 200 micrometers.

Optionally, the display substrate is an OLED flexible substrate.

The disclosure further discloses a display device which includes the display module according to any one of the above.

Optionally, the display device further includes a keyboard assembly and a rotating shaft assembly: the rotating shaft assembly is arranged at a first edge of the display substrate, and the keyboard assembly is connected with the display substrate through the rotating shaft assembly:
the circuit board and the second part of the supporting plate cross the rotating shaft assembly and extend into the keyboard assembly; and the circuit board and the second part of the supporting plate are able to be bent around the rotating shaft assembly.

DETAILED DESCRIPTION OF THE EMBODIMENTS

In an LCD product, the display module includes a double-layer glass substrate and is fixed by a backlight iron frame and a backlight rubber frame on the back surface, so that the bending condition is generally avoided, and the mechanism of the module is relatively stable. A base material of an existing OLED module is a Polyimide film (PI) film and belongs to a flexible material, the back of the existing OLED module is mostly made of foam, metal foil and other materials, so that the whole module is soft, the area of a flexible printed circuit (FPC) and the area of a printed circuit board (PCB) are very prone to bending in a laminated structure, and wiring on a display substrate, or the bonding area of the FPC or the FPC is relatively fragile. When the product is frequently bent, the bending positions are easy to crack, tilt or peel, so that the product is invalid. Especially for a product of which the FPC is not bent to the back of the display product to be attached and fixed, the problem that the binding position of the FPC is loosened or cracked easily occurs in the product.

Figure 1:
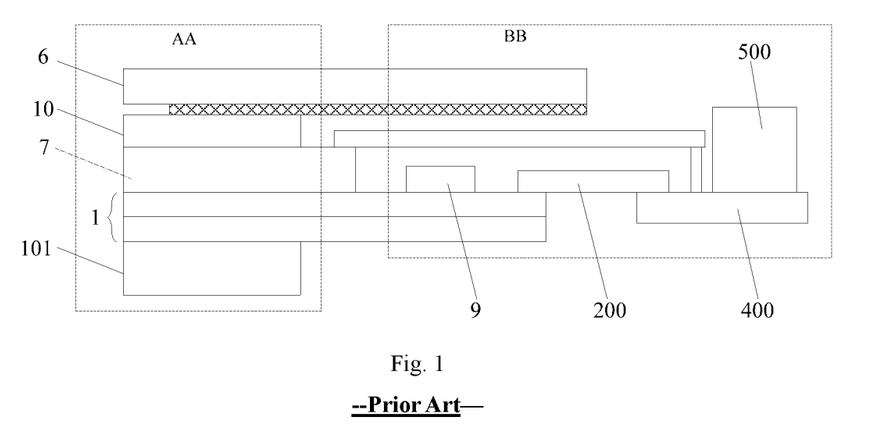
FIG. 1 is a schematic diagram of a partial cross-section structure of the display module in the related technology.

Specifically, by taking a notebook product as an example, as the requirement for the thickness of a screen is high, the notebook product generally adopts a solution that the FPC is not bent, as shown in a laminated diagram in FIG. 1, in a display module of the related technology, a touch substrate 7, a display substrate 1 and other structures are fixed on a cover plate 6 in a display area AA of the module through Optical Clear Adhesive (OCA) 10, however, in a flexible circuit board and circuit board area BB, due to the existence of parts such as an IC 9, an FPC 200, an inductance component 500, and the like, the flatness is poor, this part is difficult to fix with the cover plate 6 by using rubber materials such as the OCA and PSA, and this part is often positioned outside the cover plate 6 and is hidden under a keyboard of a notebook computer in the subsequent process in view of a narrow frame of a terminal product. According to the design of the module, when the module is delivered, the FPC 200 and the PCB 400 are in a movable state, so that the FPC binding position is easy to loosen or the FPC is easy to crack during the turnover and whole-machine assembly of the module product.

In view of the research of the inventor, the disclosure provides a design solution of the display substrate, and the design solution is used for solving the problem that the FPC binding position of an OLED display product is easy to loosen or crack.

The technical solutions in the embodiments of the present application will be clearly and completely described below in conjunction with drawings in the embodiments of the present application, obviously, the described embodiments are only a part of the embodiments of the present application, not all of the embodiments. Based on the embodiments in the present application, all other embodiments acquired by those of ordinary skill in the art without creative work shall fall within the protection scope of the present application.

It should be understood that the terms used herein to describe the embodiments of the disclosure are not intended to limit and/or define the scope of the disclosure. For example, unless defined otherwise, technical terms or scientific terms used in the present disclosure shall have the ordinary meaning as understood by those of ordinary skill in the art. The "first", "second" and similar words used in the disclosure do not represent any sequence, number or importance, but are only used for distinguishing different components. Unless the context is clearly pointed out, the similar words, such as "one", "an" or "the", in the singular form do not represent the number limitation, but represent that at least one exists. Furthermore, it can be understood that the 'edge' in the application refers to a part defining the peripheral contour of the structure and can include the edge part and/or boundary of the structure: for example, the edge of the display substrate refers to the edge part of the display substrate: in the supporting plate, one side edge of the first part is connected with the second part, the other side edges of the first part form the edge parts of the supporting plate, and furthermore, the edge of the first part includes the edge part and also includes a boundary distinguished from the second part.

Figure 2:
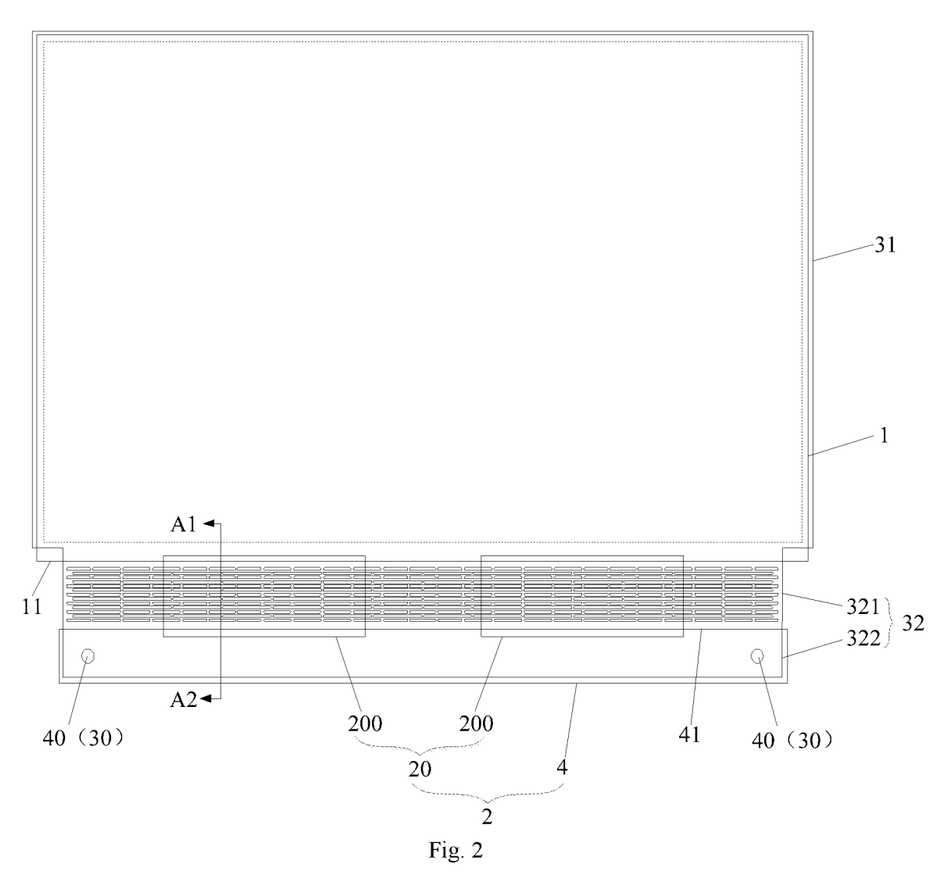
FIG. 2 is a schematic diagram of a partial structure of the display module provided by the embodiments of the disclosure.
Figure 3:
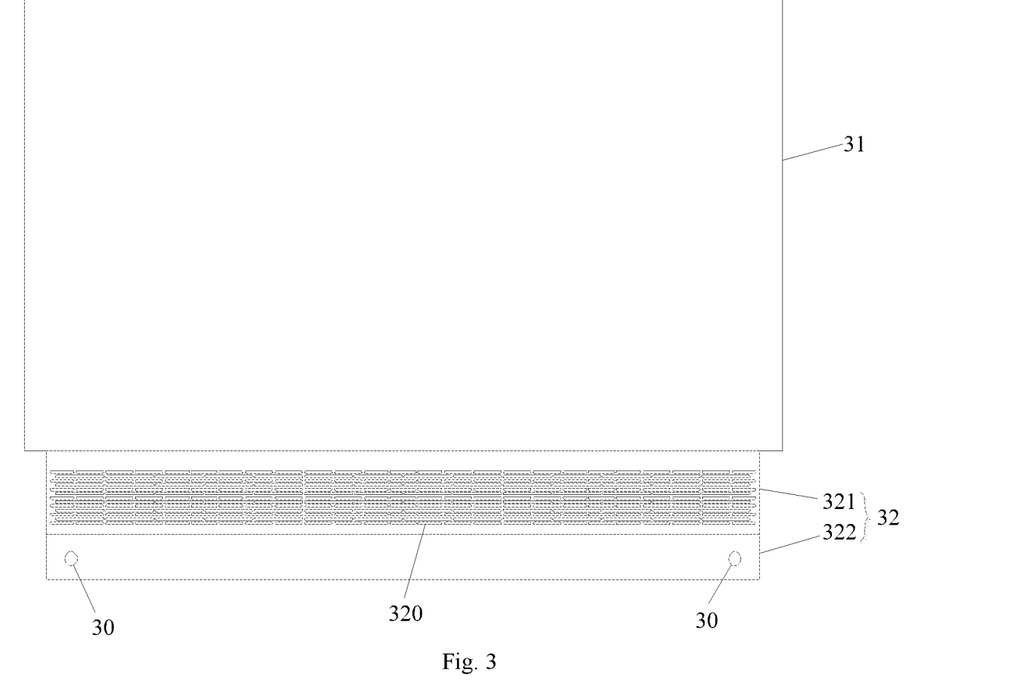
FIG. 3 is a structural schematic diagram of the supporting plate in the display module provided by the embodiments of the disclosure.
Figure 4:
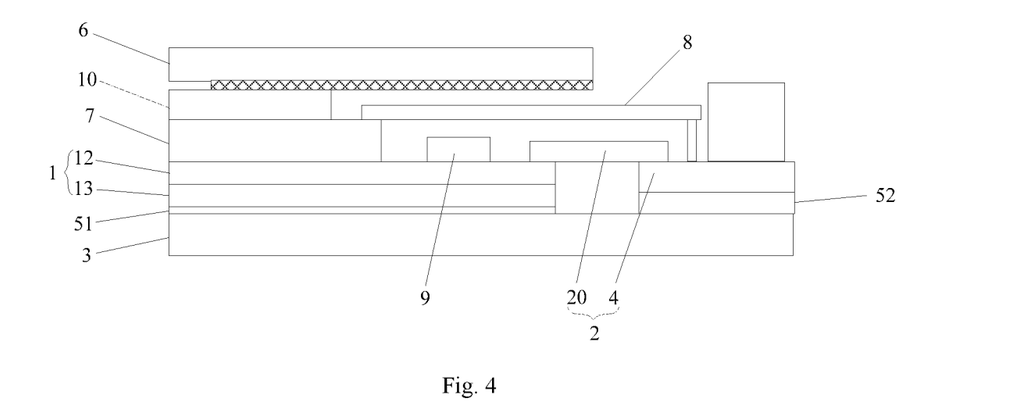
FIG. 4 is a schematic diagram of a cross-section structure of the display module in the A1-A2 direction in FIG. 2.

As shown in FIG. 2, FIG. 3 and FIG. 4, the embodiments of the disclosure provides a display module, including:
a display substrate 1, which is provided with a first edge 11;
a circuit board 2, which is arranged at the first edge 11 of the display substrate 1 and is electrically connected with the display substrate 1; and
a supporting plate 3, which is arranged on a non-display surface of the display substrate 1; the supporting plate 3 is able to be bent and includes a first part 31 and a second part 32, and the second part 32 is provided with a hollow opening: the display substrate 1 is positioned on the first part 31 and is fixedly connected with the first part 31; and the circuit board 2 is positioned on the second part 32 and is fixedly connected with the second part 32.

According to the display module provided by the embodiments of the application, a bendable supporting plate 3 is arranged on the back side (a non-display surface) of the display substrate 1, the supporting plate 3 includes a first part 31 and a second part 32, the display substrate 1 and the circuit board 2 are arranged on the first part 31 and the second part 32 respectively, specifically; the first part 31 can fix and support the display substrate 1, and the second part 32 can fix and support the circuit board 2, so that when the display module is flattened and delivered, the display substrate 1 and the circuit board 2 are relatively stable, the mechanical firmness is relatively strong, and the problem that the binding position of the circuit board 2 is loosened or cracked is not easy to occur. Moreover, the second part 32 of the supporting plate 3 is provided with a hollow opening, has high bending performance and can be bent along with the circuit board 2 according to requirements, especially when the circuit board 2 is arranged around a rotating shaft of a folding display product (such as a notebook computer), the second part 32 of the supporting plate 3 can be repeatedly bent around the rotating shaft, and then the requirement for repeated folding of the display product is met.

In conclusion, according to the display module provided by the embodiments of the disclosure, the situation that the binding position of the circuit board 2 is loosened or cracked is not likely to occur, and the mechanical reliability problem of the display module in the transportation and machining process can be solved.

In an optional embodiment, in the embodiments of the disclosure, the supporting plate is of an integrated structure.

Exemplary, the supporting plate may be a stainless steel plate (SUS).

Specifically, the SUS material can realize the small-radius bending of 2-5 mm, and can meet the requirement of 200 thousand times of repeated bending, so that the display terminal can meet the requirement of arranging the circuit board 2 and the second part of the supporting plate around the rotating shaft.

In addition, the supporting plate is a stainless steel plate, is arranged on the back face of the display substrate and can be used as a heat dissipation structure of the display module. Furthermore, in the display module provided by the embodiments of the disclosure, a heat dissipation module (SCF) (referring to SCF 101 in FIG. 1) in a conventional display product can be omitted.

Exemplary, in the embodiments of the disclosure, the thickness of the supporting plate can range from 50 to 200 micrometers.

In an optional embodiment, as shown in FIG. 2 and FIG. 4, the circuit board 2 includes a soft part 20 and a hard part 4, the hard part 4 is arranged on a side, away from the display substrate 1, of the soft part 20, and the soft part 20 can be bent.

Exemplary, the soft part and the hard part may be an integral structure (such as a flexible printed circuit (FPC)), with an electrical device disposed in the hard part.

Or as shown in FIG. 2 and FIG. 4, the soft part 20 and the hard part 4 can also be separated, the soft part 20 can be a chip on film (COF), the hard part 4 can be a printed circuit board (PCB), and the soft part 20 and the hard part 4 are connected in a binding mode.

Furthermore, as shown in FIG. 2, FIG. 3 and FIG. 4, the second part 32 of the supporting plate 3 includes a connecting part 321 and a fixed part 322, and the connecting part 321 is provided with a hollow opening: the fixed part 322 is arranged on a side, away from the first part 31, of the connecting part 321. The soft part 20 of the circuit board 2 is arranged on the connecting part 321, and the hard part 4 of the circuit board 2 is arranged on the fixed part 322 and fixedly connected with the fixed part 322.

Figure 6:
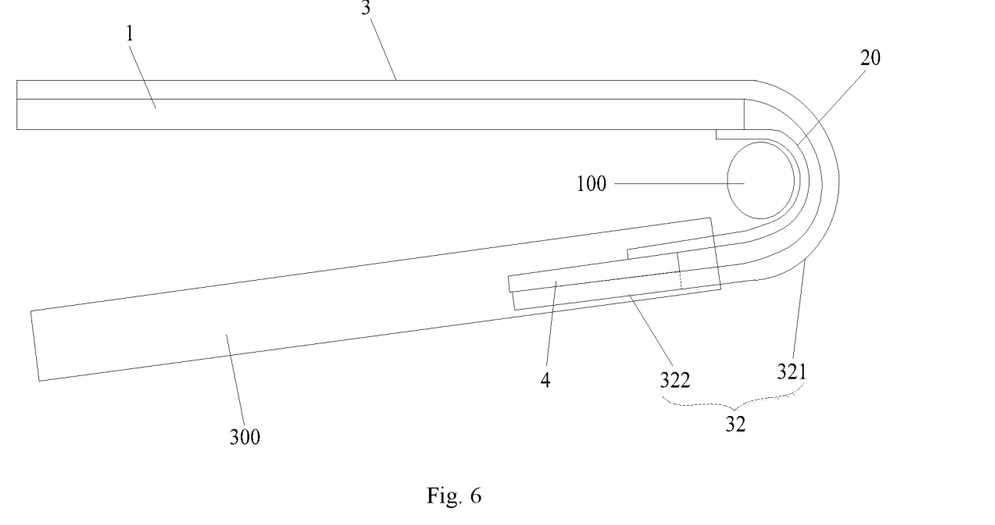
FIG. 6 is a schematic diagram of a partial structure of the display device provided by the embodiments of the disclosure.

Accordingly, the connecting part 321 of the supporting plate 3 and the soft part 20 of the circuit board 2 can be bent according to actual product requirements, for example, as shown in FIG. 6, the connecting part 321 of the supporting plate 3 and the soft part 20 of the circuit board can be arranged around a rotating shaft assembly 100 of a folding display product (such as a notebook computer), and at the moment, the connecting part 321 of the supporting plate 3 and the soft part 20 of the circuit board can be repeatedly bent around the rotating shaft assembly 100, and then the requirement for repeated folding of a display product is met. In the embodiments of the disclosure, the hollow opening is formed in the connecting part 321 of the supporting plate 3, so that the bending performance of the connecting part 321 can be further improved, and the supporting plate 3 can better meet the bending requirement of a display product.

As shown in FIG. 2, the supporting plate 3 includes a first part 31, a connecting part 321 and a fixed part 322 which are connected in sequence, the connecting part 321 is arranged between the first part 31 and the fixed part 322, and the display substrate 1 and the hard part 4 of the circuit board 2 are arranged on the first part 31 and the fixed part 322 respectively, and the hard part 4 of the circuit board 2 are fixedly connected with the first part 31 and the fixed part 322 respectively, namely, the display substrate 1 and the hard part 4 of the circuit board 2 are respectively fixed on the supporting plate 3, so that the display substrate 1 and the circuit board 2 can be relatively fixed, the mechanical firmness of the whole module is enhanced, and the mechanical reliability of the display module in the transportation and processing process can be effectively improved.

In an optional embodiment, as shown in FIG. 2 and FIG. 3, the projection of the hard part 4 on the plane where the supporting plate 3 is located is approximately overlapped with the fixed part 322: in other words, the projection of an edge of the hard part 4 on the plane where the supporting plate 3 is located is close to an edge of the fixed part 322 of the supporting plate 3, and the extension trends are roughly the same.

Exemplary, a distance between the projection of the edge of the hard part 4 on the plane where the supporting plate 3 is located and an edge of the fixed part 322 closest to the edge of the hard part 4 ranges from 0 to 0.5 mm, that is, the distance between the projection of each edge of the hard part 4 on the plane where the supporting plate 3 is located and each corresponding edge of the fixed part 322 is smaller than or equal to 0.5 mm.

Exemplary, as shown in FIG. 2 and FIG. 3, a shape of the hard part 4 of the circuit board 2 and a shape of the fixed part 322 of the supporting plate 3 each is rectangular, the edges of the two rectangles are correspondingly arranged, two correspondingly arranged edges are parallel, and a distance between the projections of the two correspondingly arranged edges is ranges from 0 mm to 0.5 mm.

In an optional embodiment, as shown in FIG. 2, the hard part 4 includes a second edge 41, and the second edge 41 is close to the first edge 11 of the display substrate 1.

Exemplary, as shown in FIG. 2 and FIG. 3, the projections of edges, other than the second edge 41, in the hard part 4 on the plane where the supporting plate 3 is located do not overlap with the fixed part 322 of the supporting plate 3. In other words, the projections of the edges, other than the second edge 41, in the hard part 4 surround the corresponding edges of the fixed part 322, or most of the edges of the fixed part 322 of the supporting plate 3 are shrunk inwards relative to the edges of the hard part 4. Therefore, the space required by the hard part 4 and the fixed part 322 can be reduced as much as possible, and the size of the whole machine is reduced.

For example, the projections of the edges, other than the second edge 41, in the hard part 4 exceed the corresponding closest edges in the fixed part 322, and the exceeding size can be 0.5 mm, 0.4 mm, 0.3 mm, 0.2 mm or 0.1 mm; and the second edge 41 of the hard part 4 is aligned with an edge, parallel to and closest to the second edge 41, of the fixed part 322, that is, the edge, parallel to and closest to the second edge 41, of the fixed part 322 is a boundary between the connecting part 321 and the fixed part 322, which can be regarded as an upper edge of the fixed part 322 as shown in FIG. 2, and the distance between the projection of the second edge 41 on the plane of the supporting plate 3 and the upper edge of the fixed part 322 is 0. In other words, the projection of the second edge 41 on the plane of the supporting plate 3 coincides with the upper edge of the fixed part 322.

Exemplary, as shown in FIG. 2 and FIG. 3, the connecting part 321 of the supporting plate 3 is rectangular and has two pairs of opposite edges: the first pair of opposite edges is respectively connected with the first part 31 and the fixed part 322, and the second pair of opposite edges exceeds the two side edges of the soft part 20 of the circuit board 2. For example, the soft part 20 includes at least two flexible connectors 200 arranged along the first edge 11 of the display substrate 1, and the second pair of opposite edges of the connecting part 321 exceeds the outer edges of the two flexible connectors 200 at the two ends.

In an optional embodiment, as shown in FIG. 2 and FIG. 3, the projection of the display substrate 1 on the plane where the supporting plate 3 is located is approximately overlapped with the first part 31: in other words, the projection of the edge of the display substrate 1 on the plane where the supporting plate 3 is located is close to the edge of the first part 31 of the supporting plate 3, and the extension trends are roughly the same.

Exemplary, a distance between a projection of a edge of the display substrate 1 on the plane where the supporting plate 3 is located and a edge of the first part 31 closest the projection of the edge of the display substrate 1 ranges from 0 mm to 0.5 mm, namely, the distance between the projection of each edge of the display substrate 1 on the plane where the supporting plate 3 is located and each corresponding edge in the first part 31 is smaller than or equal to 0.5 mm.

Exemplary, as shown in FIG. 2 and FIG. 3, a shape of the display substrate 1 and a shape of the first part 31 of the supporting plate 3 are rectangular, the edges of the two rectangles are correspondingly arranged, the two correspondingly arranged edges are parallel, and the distance between the projections of the two correspondingly arranged edges ranges from 0 mm to 0.5 mm.

In an optional embodiment, as shown in FIG. 4, the display module provided by the embodiments of the disclosure can further include a cover plate 6 arranged on the side, away from the supporting plate 3, of the display substrate 1.

Exemplary, the cover plate may be a flexible material, such as a PI material. Accordingly, as shown in FIG. 2 and FIG. 3, the projections of the edges, other than a edge close to a side of the second part 32, in the first part 31 of the supporting plate 3 on the plane where the display substrate 1 is located are not overlapped with the display substrate 1. In other words, the edges of the first portion 31 of the supporting plate 3 mostly surround the edges of the display substrate 1. Thus, the first part 31 of the supporting plate 3 can well support and protect the whole display substrate 1, so that the problem that the supporting capacity of the flexible cover plate is insufficient is solved, and the strength of the display substrate 1 is effectively improved.

For example, the projections of the edges, other than the edge close to the side of the second part 32, in the first part 31 of the supporting plate 3 on the plane where the display substrate 1 is located exceed the corresponding closest edges in the display substrate 1, and the exceeding sizes can be 0.5 mm, 0.4 mm, 0.3 mm, 0.2 mm or 0.1 mm: the projection of the edge, close to the side of the second part 32, in the first part 31 of the supporting plate 3 on the plane where the display substrate 1 is located shrinks inwards relative to the corresponding closest edge which has the same extending direction in the display substrate 1, and the inward shrinkage size can be 0.5 mm, 0.4 mm, 0.3 mm, 0.2 mm or 0.1 mm.

Certainly, the cover plate of the display module can also be made of a rigid material, such as glass. At the moment, the projections of the edges, other than the first side 11, in the display substrate 1 on the plane where the supporting plate 3 is located can be not overlapped with the first part 31, that is, most of the edges of the first part 31 of the supporting plate 3 shrink inwards relative to the edges of the display substrate 1. Therefore, the space required by the display substrate 1 and the first part 31 of the supporting plate 3 can be reduced as much as possible, the size of the whole machine is reduced, and the narrow frame design of a display product is facilitated.

In an optional embodiment, as shown in FIG. 2 and FIG. 3, a width of the connecting part 321 and a width of the fixed part 322 of the supporting plate 3 are smaller than a width of the first part 31 in an extending direction of the first edge 11 of the display substrate 1.

Exemplary, as shown in FIG. 2 and FIG. 3, the width of the connecting part 321 and the width of the fixed part 322 of the supporting plate 3 can be the same in the extending direction of the first edge 11 of the display substrate 1.

According to the size design, on one hand, the strength and the supporting performance of the supporting plate can be guaranteed, on the other hand, the bending performance of the connecting part of the supporting plate can be improved, in addition, the area of the supporting plate can be reduced as much as possible, and overall assembly of the display module is facilitated.

In an optional embodiment, as shown in FIG. 4, the display substrate 1 and the hard part 4 of the circuit board 2 are respectively attached and fixed to the supporting plate 3.

Exemplary, as shown in FIG. 4, the display substrate 1 includes a display panel 12 and a back film 13 arranged between the display panel 12 and the supporting plate 3. The display module includes a first adhesive layer 51, the first adhesive layer 51 is between the back film 13 and the first part of the supporting plate 3, and the back film 13 is fixedly connected with the first part of the supporting plate 3 through the first adhesive layer 51.

For example, as shown in FIG. 4, the display module further includes a second adhesive layer 52, the second adhesive layer 52 is between the hard part 4 of the circuit board 2 and the fixed part of the supporting plate 3, and the hard part 4 of the circuit board 2 is fixedly connected with the fixed part of the supporting plate 3 through the second adhesive layer 52.

Exemplary, the first adhesive layer and the second adhesive layer may be an optically clear adhesive (OCA) or a pressure-sensitive adhesive (PSA).

Specifically, in the actual assembling process, as shown in FIG. 4, the first adhesive layer 51 can be supplied on the supporting plate 3, and the second adhesive layer 52 can be supplied on the supporting plate 3 and can also be supplied on the hard part (such as a circuit board) 4 of the circuit board 2.

In an optional embodiment, as shown in FIG. 2 and FIG. 3, the hard part 4 of the circuit board 2 is provided with first positioning holes 40: the fixed part 322 of the supporting plate 3 is provided with second positioning holes 30 corresponding to the first positioning holes 40, and the projection of the first positioning hole 40 on the plane where the supporting plate 3 is located is overlapped with the second positioning hole 30.

Exemplary, as shown in FIG. 2, the hard part 4 is a strip-shaped plate extending along the first edge 11 of the display substrate 1: the hard part 4 is provided with two first positioning holes 40, and the two first positioning holes 40 are arranged at the two ends of the hard part 4 respectively.

Accordingly, the first positioning hole 40 is aligned with the second positioning hole 30, so that mutual positioning of the hard part 4 of the circuit board 2 and the supporting plate 3 can be facilitated.

Exemplary, as shown in FIG. 2, the display module provided by the embodiments of the disclosure can further include connectors (not shown in Fig.), and the connectors are configured to penetrate through the first positioning holes 40 and the second positioning holes 30 so as to fix the hard part 4 of the circuit board 2 and the fixed part 322 of the supporting plate 3.

Figure 5:
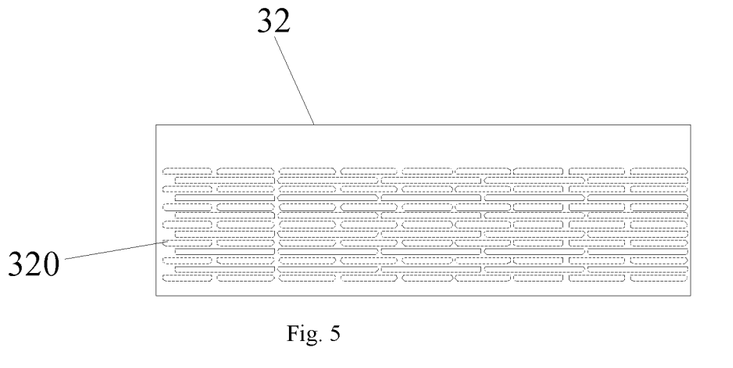
FIG. 5 is a schematic diagram of a partial amplification structure of the supporting plate in FIG. 3.

Exemplary, the connecting piece may include a screw:

In an optional embodiment, as shown in FIG. 5, a hollow opening is formed in a connecting part 321 of the supporting plate, the hollow opening includes at least two rows of through holes 320, each row of through holes 320 are arranged in the extending direction of the first edge 11 of the display substrate 1, and the through holes 320 in odd rows and the through holes 320 in even rows are at least partially staggered. Therefore, the bending performance of the connecting part 321 can be effectively improved while the supporting strength of the connecting part 321 is ensured, so that the connecting part 321 can be bent in a small radius and can be repeatedly bent.

Exemplary, the through hole can be a strip-shaped hole extending in the extending direction of the first edge of the display substrate.

As shown in FIG. 2, the connecting part 321 of the supporting plate 3 is bent along with the soft part 20 of the circuit board 2, the bending axis of the connecting part 321 is the same as the extending direction of the first edge 11 of the display substrate 1, and the through hole in the connecting part 321 is arranged to be a strip-shaped hole, a extending direction of the strip-shaped hole is the same as the extending direction of the first edge 11, namely, the extending direction of the through hole is the same as the extending direction of the bending axis, and the bending performance of the connecting part 321 can be improved.

In an optional embodiment, in the display module provided by the embodiments of the disclosure, the display substrate is an OLED flexible substrate.

In an optional embodiment, the display module provided by the embodiments of the disclosure can further include other structures, for example, as shown in FIG. 4, the display module can further include a touch substrate 7, a touch flexible circuit board 8, an integrated circuit (IC) 9, an optical adhesive 10 used for being attached to the cover plate 6 and the like.

In addition, the embodiments of the disclosure further provide a display device, and the display device includes the display module according to any one of the above.

In an optional embodiment, the display device provided by the embodiments of the disclosure can be a notebook product.

Exemplary, as shown in FIG. 6, the display device provided by the embodiments of the disclosure further includes a keyboard assembly 300 and a rotating shaft assembly 100, the rotating shaft assembly 100 is arranged on the first edge of the display substrate 1, and the keyboard assembly 300 is connected with the display substrate 1 through the rotating shaft assembly 100. Specifically, the keyboard assembly 300 is pivoted with the display substrate 1 through the rotating shaft assembly 100.

Furthermore, as shown in FIG. 6, the circuit board and the second part 32 of the supporting plate 3 cross the rotating shaft assembly 100 and extend into the keyboard assembly 300; and the circuit board and the second part 32 of the supporting plate 3 can be bent around the rotating shaft assembly 100.

Exemplary, the soft part 20 of the circuit board and the connecting part 321 of the supporting plate 3 are arranged around the rotating shaft assembly 100 and can be bent around the rotating shaft assembly 100; and the hard part 4 of the circuit board and the fixed part 322 of the supporting plate 3 extend into the keyboard assembly 300.

For example, the keyboard assembly includes a shell and a keyboard arranged at the upper part of the shell, and the hard part of the circuit board and the fixed part of the supporting plate extend into the shell and are hidden below the keyboard.

Certainly, the display device provided by the embodiments of the disclosure is not limited to a notebook computer, and can also be applied to a mobile phone, a tablet personal computer or other display products. In addition, the display device is particularly suitable for narrow-frame products, products in which the FPC is exposed outside the cover plate, flexible display products and the like, such as multilateral curved surface display products.

Accordingly, the display device provided by the embodiments of the disclosure adopts the design that the supporting plate is arranged on the back surfaces of the display substrate and the circuit board, so that on one hand, the problem that the binding position of the circuit board is easy to loosen or crack is solved, and the mechanical reliability of the display module in the transportation and processing process is improved: on the other hand, the bending requirement of the circuit board can be guaranteed, and the bending performance of the bending area of the circuit board is improved. Furthermore, the yield of display products can be greatly improved.

It needs to be explained that in some embodiments of the disclosure, the display module and the display device can further include other structures, which can be determined according to actual requirements, and the embodiments of the disclosure do not limit the structure. In addition, each embodiment of the disclosure is only an example of a specific implementation solution, and the solution of the disclosure is not limited to the above embodiment. The attached drawings provided by the embodiments of the disclosure are only schematic diagrams, and the actual size and proportion of each structure are not limited to the measurement size in the attached drawings.

Obviously, those skilled in the art can make various changes and modifications to the embodiments of the present application without departing from the spirit and scope of the present application. As such, provided that these modifications and variations of the present application fall within the scope of the claims of the present application and their equivalents, the present application is also intended to cover such modifications and variations.

What is claimed is:

1. A display module, comprising: a display substrate provided with a first edge; a circuit board arranged at the first edge of the display substrate and electrically connected with the display substrate; and a supporting plate arranged on a non-display surface of the display substrate; wherein the supporting plate is able to be bent and comprises a first part and a second part, and the second part is provided with a hollow opening; wherein the display substrate is positioned on the first part and is fixedly connected with the first part;

and the circuit board is positioned on the second part and is fixedly connected with the second part, wherein the circuit board comprises a soft part and a hard part, the hard part is arranged on a side, away from the display substrate, of the soft part, and the soft part is able to be bent; and the second part of the supporting plate comprises a connecting part and a fixed part; the fixed part is arranged on a side, away from the first part, of the connecting part, and the connecting part is provided with the hollow opening; the soft part is arranged on the connecting part, and the hard part is arranged on the fixed part and fixedly connected with the fixed part.

2. The display module according to claim 1, wherein the hard part is provided with first positioning holes; and
the fixed part of the supporting plate is provided with second positioning holes corresponding to the first positioning holes, and projections of the first positioning holes on a plane where the supporting plate is located are overlapped with the second positioning holes.

3. The display module according to claim 2, wherein the hard part is in a strip shape and extends along the first edge of the display substrate; and
the hard part is provided with two first positioning holes, and the two first positioning holes are arranged at two ends of the hard part respectively.

4. The display module according to claim 2, further comprising connectors, wherein the connectors are configured to penetrate through the first positioning holes and the second positioning holes to fix the hard part and the fixed part of the supporting plate.

5. The display module according to claim 1, wherein a projection, on the plane where the supporting plate is located, of the hard part roughly coincides with the fixed part; and a distance between a projection of an edge of the hard part on the plane where the supporting plate is located and an edge of the fixed part closest to the edge of the hard part ranges from 0 mm to 0.5 mm.

6. The display module according to claim 5, wherein the hard part comprises a second edge, and the second edge is close to the first edge of the display substrate; and
projections of edges, other than the second edge, in the hard part on the plane where the supporting plate is located are not overlapped with the fixed part.

7. The display module according to claim 1, wherein a projection of the display substrate on the plane where the supporting plate is located roughly coincides with the first part; and a distance between a projection of each edge of the display substrate on the plane where the supporting plate is located and an edge of the first part closest to the each edge of the display substrate ranges from 0 mm to 0.5 mm.

8. The display module according to claim 7, further comprising a cover plate arranged on a side, away from the supporting plate, of the display substrate, wherein the cover plate is made of a flexible material; and
projections of edges, other than an edge close to one side of the second part, in the first part on the plane where the display substrate is located are not overlapped with the display substrate.

9. The display module according to claim 1, wherein a width of the connecting part and a width of the fixed part of the supporting plate are smaller than a width of the first part in an extending direction of the first edge of the display substrate.

10. The display module according to claim 9, wherein the width of the connecting part of the supporting plate is identical to the width of the fixed part of the supporting plate in the extending direction of the first edge of the display substrate.

11. The display module according to claim 1, wherein the hollow opening comprises at least two rows of through holes, each row of through holes are arranged in the extending direction of the first edge of the display substrate, and through holes in an odd number rows and through holes in an even number rows are at least partially staggered.

12. The display module according to claim 11, wherein the through hole is a strip-shaped hole extending in the extending direction of the first edge.

13. The display module according to claim 1, wherein the supporting plate is of an integrated structure.

14. The display module according to claim 1, wherein the supporting plate is a stainless steel plate.

15. The display module according to claim 14, wherein a thickness of the supporting plate ranges from 50 micrometers to 200 micrometers.

16. The display module according to claim 1, wherein the display substrate is a flexible organic light emitting diode (OLED) substrate.

17. A display device, comprising the display module claim 1.

18. The display device according to claim 17, further comprising a keyboard assembly and a rotating shaft assembly, wherein:
the rotating shaft assembly is arranged at a first edge of the display substrate, and the keyboard assembly is connected with the display substrate through the rotating shaft assembly;
the circuit board and the second part of the supporting plate cross the rotating shaft assembly and extend into the keyboard assembly; and
the circuit board and the second part of the supporting plate are able to be bent around the rotating shaft assembly.

* * * * *